(12) United States Patent
Chung et al.

(10) Patent No.: US 7,994,815 B2
(45) Date of Patent: Aug. 9, 2011

(54) CROSS-POINT LATCH AND METHOD OF OPERATING THE SAME

(75) Inventors: Hyun-jong Chung, Hwaseong-si (KR);
Sun-ae Seo, Hwaseong-si (KR);
Chang-won Lee, Seoul (KR);
Dae-young Jeon, Mokpo-si (KR);
Ran-ju Jung, Suwon-si (KR);
Dong-chul Kim, Suwon-si (KR);
Ji-young Bae, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 895 days.

(21) Appl. No.: 11/902,416

(22) Filed: Sep. 21, 2007

(65) Prior Publication Data
US 2008/0284481 A1 Nov. 20, 2008

(30) Foreign Application Priority Data

May 16, 2007 (KR) .......................... 10-2007-0047833

(51) Int. Cl.
*H03K 19/173* (2006.01)
(52) U.S. Cl. ............ 326/37; 326/39; 326/101; 365/151; 365/189.05; 365/230.08
(58) Field of Classification Search .................. 326/37, 326/39, 101; 365/151, 189.05, 230.08
See application file for complete search history.

(56) References Cited

U.S. PATENT DOCUMENTS

| 5,991,193 | A | * | 11/1999 | Gallagher et al. | 365/171 |
|---|---|---|---|---|---|
| 6,128,214 | A | * | 10/2000 | Kuekes et al. | 365/151 |
| 6,130,835 | A | * | 10/2000 | Scheuerlein | 365/171 |
| 6,589,965 | B2 | * | 7/2003 | Svensson | 514/317 |
| 7,257,016 | B2 | * | 8/2007 | Snider | 365/151 |
| 7,302,513 | B2 | * | 11/2007 | Mouttet | 710/317 |
| 7,307,448 | B2 | * | 12/2007 | Snider et al. | 326/38 |
| 2002/0114557 | A1 | * | 8/2002 | Zhang et al. | 385/17 |
| 2003/0173595 | A1 | * | 9/2003 | Kuekes | 257/202 |
| 2006/0268598 | A1 | * | 11/2006 | Snider | 365/151 |

FOREIGN PATENT DOCUMENTS

KR 10-2005-0040829 5/2005
WO WO 03/038833 5/2003

* cited by examiner

*Primary Examiner* — Linh V Nguyen
(74) *Attorney, Agent, or Firm* — Harness, Dickey & Pierce, P.L.C.

(57) ABSTRACT

Provided is a cross-point latch and a method of operating the cross-point latch. The cross-point latch includes a signal line, two control lines crossing the signal line, and unipolar switches disposed at crossing points between the signal line and the control lines.

21 Claims, 8 Drawing Sheets

FIG. 9B

CROSS-POINT LATCH AND METHOD OF OPERATING THE SAME

CROSS-REFERENCE TO RELATED PATENT APPLICATION

This application claims the benefit of Korean Patent Application No. 10-2007-0047833, filed on May 16, 2007, in the Korean Intellectual Property Office, the disclosure of which is incorporated herein in its entirety by reference.

BACKGROUND OF THE INVENTION

1. Field of the Invention

The present invention relates to a semiconductor device and a method of operating the same, and more particularly, to a cross-point latch, a method of latching of a logic value and methods of restoration and inversion of signal using the cross-point latch.

2. Description of the Related Art

Digital circuits comprise combinational circuits and sequential circuits. A combinational circuit has no memory and is a circuit in which an output is determined by an input. However, a sequential circuit is a circuit in which an output is determined by both an input and a state value (which is determined by inputs in the past) stored in the circuit. A sequential circuit has a memory device in the circuit for storing values. The memory device is called a flip-flop device. The flip-flop device can store information of 1 bit (0 or 1), and can be configured to various ways according to methods of connecting logic gates.

A latch is an example of the flip-flop device. In order to increase integration density of the latch, a molecule cross-bar latch has been disclosed, for example, in Korean patent publication No. 10-2005-0040829.

The molecule cross-bar latch has advantages in increasing the integration density, however, has the following disadvantages.

First, a molecule switch used for the molecule cross-bar latch has bipolar switching characteristics. Therefore, in order to be operated as the molecule cross-bar latch, the molecule switch must be repeatedly set and reset, which will now be described with reference to FIG. 1.

Figure 1:
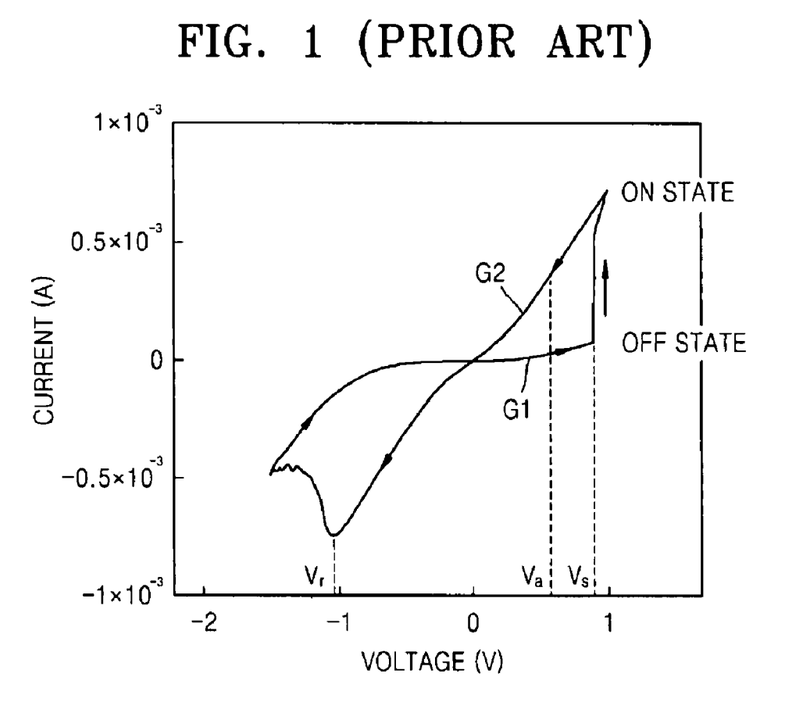
FIG. 1 is a graph showing voltage-current characteristics of a bipolar switch included in a conventional molecule crossbar latch.

FIG. 1 is a graph showing voltage-current characteristics of a molecule switch used for a conventional molecule cross-bar latch. In FIG. 1, a first graph G1 shows an opening state of the molecule switch, that is, an OFF state, and a second graph G2 shows a closed state of the molecule switch, that is, an ON state.

Referring to FIG. 1, when a voltage greater than a set voltage Vs is applied to the molecule switch, the resistance of the molecule switch is rapidly reduced, and the voltage-current characteristic of the molecule switch follows the second graph G2. This is an ON state. Afterwards, when a voltage lower than a reset voltage Vr is applied to the molecule switch, the resistance of the molecule switch rapidly increases, and the voltage-current characteristic of the molecule switch follows the first graph G1. This is an OFF state.

When a positive (+) voltage Va smaller than the set voltage Vs is applied to the molecule switch, the molecule switch can be in an ON state or an OFF state. Thus, in order to operate the molecule cross-bar latch at the voltage Va, the set and reset operations of the molecule switch must be repeated. For example, when the molecule switch is reset, the molecule switch is in an OFF state at the voltage Va, and when the molecule switch is set, the molecule switch is in an ON state at the voltage Va. In this way, in order to operate the molecule cross-bar latch, the molecule switch must be repeatedly set and reset, thereby increasing latching time.

Second, the conventional molecule cross-bar latch uses molecules such as rotaxanes as the switching material, and thus, the molecule cross-bar latch may be weak to various physical and chemical environments that are exposed when the same is manufactured or used. Thus, the manufacture of the molecule cross-bar latch is difficult and the reliability can be hardly ensured.

SUMMARY OF THE INVENTION

To solve the above and/or other problems, the present invention provides a cross-point latch that can reduce latching time, can be easily manufactured, and has high reliability.

The present invention also provides a method of operating the cross-point latch.

According to an aspect of the present invention, there is provided a cross-point latch comprising: a signal line; two control lines crossing the signal line; and unipolar switches disposed at crossing points between the signal line and the control lines.

The unipolar switches may comprise a variable resistive material.

The variable resistive material may be a metal oxide.

The metal oxide may be one selected from the group consisting of $NiO$, $FeO$, $CoO$, $NbO_2$, $ZrO_2$, $HfO_2$, $ZnO$, $TbO$, $YO$, and $WO_3$.

According to an aspect of the present invention, there is provided a method of operating a cross-point latch that comprises: a signal line; first and second control lines crossing the signal line; and unipolar switches disposed at crossing points between the signal line and the first and second control lines, the method comprising while an input voltage is applied to the signal line, applying voltages different from each other to the first and second control lines in order to close one of the unipolar switches and open the other one (Operation 1).

The unipolar switch may be opened by applying a voltage between a 'open 1' and a 'close 1' or a voltage between a 'open 0' and a 'close 0' to the unipolar switch, and the unipolar switch may be closed by applying a voltage greater than the 'close 1' or smaller than the 'close 0' to the unipolar switch, wherein the 'open 1' and the 'close 1' are greater than a 'ground' voltage, and the 'open 0' and the 'close 0' are smaller than the 'ground' voltage, and the 'open 1' is smaller than the 'close 1', and the 'close 0' is smaller than the 'open 0'.

The input voltage may be for outputting a logic 1 and may lie between 'weak 1' and 'strong 1'; the 'weak 1' and the 'strong 1' may lie between the 'ground' voltage and the 'open 1'; and the 'weak 1' may be smaller than the 'strong 1'.

The input voltage may be for outputting a logic 1 and may lie between 'weak 0' and 'strong 0'; the 'weak 0' and the 'strong 0' may lie between the 'ground' voltage and the 'open 0'; and the 'weak 0' may be greater than the 'strong 0'.

The method may further comprise, in a state that the input voltage is not applied to the signal line, applying a voltage of the 'strong 1' level to the control line connected to the closed unipolar switch (Operation 2) after the operation 1, wherein the operations 1 and 2 are methods of latching a logic value using the cross-point latch or methods of signal restoration.

The method may further comprise, in a state that the input voltage is not applied to the signal line, applying a voltage of the 'strong 0' level to the control line connected to the closed unipolar switch (Operation 2) after the operation 1, wherein the operations 1 and 2 are methods of latching a logic value using the cross-point latch or methods of signal restoration.

The input voltage may be for outputting a logic 0 and may lie between 'weak 1' and 'strong 1'; the 'weak 1' and the 'strong 1' may lie between the 'ground' voltage and the 'open 1'; and the 'weak 1' may be smaller than the 'strong 1'.

The input voltage may be for outputting a logic 1 and may lie between 'weak 0' and 'strong 0'; the 'weak 0' and the 'strong 0' may lie between the 'ground' voltage and the 'open 0'; and the 'weak 0' may be greater than the 'strong 0'.

The method may further comprise, in a state that the input voltage is not applied to the signal line, applying a voltage of the 'strong 0' level to the control line connected to the closed unipolar switch (Operation 2) after the operation 1, wherein the operations 1 and 2 are methods of inverting a signal using the cross-point latch.

The method may further comprise, in a state that the input voltage is not applied to the signal line, applying a voltage of the 'strong 1' level to the control line connected to the closed unipolar switch (Operation 2) after the operation 1, wherein the operations 1 and 2 are methods of inverting a signal using the cross-point latch.

The unipolar switches may comprise a variable resistive material.

The variable resistive material may be a metal oxide.

The metal oxide may be one selected from the group consisting of NiO, FeO, CoO, NbO$_2$, ZrO$_2$, HfO$_2$, ZnO, TbO, YO, and WO$_3$.

BRIEF DESCRIPTION OF THE DRAWINGS

The above and other features and advantages of the present invention will become more apparent by describing in detail exemplary embodiments thereof with reference to the attached drawings in which:

FIGS. 5A through 7B are schematic drawings for explaining the variation of voltage applied to a signal line and a control line of the cross-point latch of FIG. 2, and the variation of voltage applied to a switch according to the variation of voltage applied to a signal line and a control line of the cross-point latch;

DETAILED DESCRIPTION OF THE INVENTION

A cross-point latch, a method of latching a logic value and methods of reconstructing and inverting a signal using the cross-point latch according to the present invention will now be described more fully with reference to the accompanying drawings in which exemplary embodiments of the invention are shown. In the drawings, the thicknesses of layers and regions are exaggerated for clarity, and like reference numerals refer to the like elements.

Figure 2:
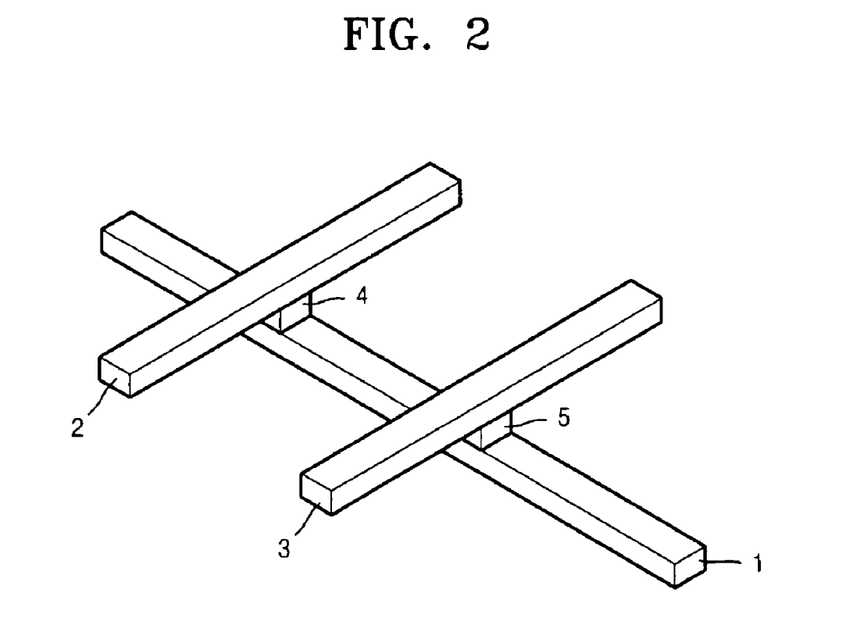
FIG. 2 is a perspective view of a cross-point latch according to an embodiment of the present invention.

FIG. 2 is a perspective view of a cross-point latch according to an embodiment of the present invention.

Referring to FIG. 2, a signal line 1 and first and second control lines 2 and 3 are present. The signal line 1 crosses the first and second control lines 2 and 3. The first and second control lines 2 and 3 are separated from each other, and do not directly contact the signal line 1. The first and second control lines 2 and 3 may be parallel to each other and may cross the signal line 1 at right angles. However, the first and second control lines 2 and 3 may not be parallel to each other and may obliquely cross the signal line 1. First and second switches 4 and 5 having a unipolar switching characteristic are respectively disposed at crossing points between the signal line 1 and the first and second control lines 2 and 3. The first and second switches 4 and 5 can be formed of a variable resistive material having a unipolar switching characteristic, for example, a metal oxide. The metal oxide can be one selected from the group consisting of NiO, FeO, CoO, NbO$_2$, ZrO$_2$, HfO$_2$, ZnO, TbO, YO, and WO$_3$.

Figure 3:
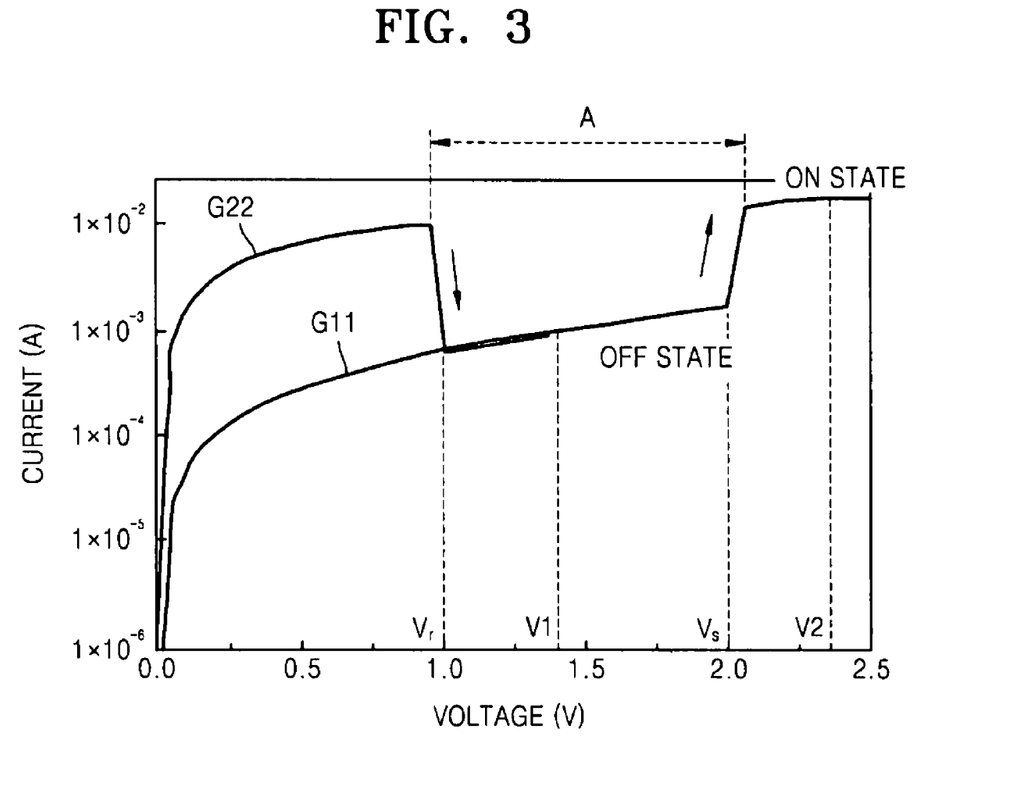
FIG. 3 is a graph showing voltage-current characteristics of a unipolar switch employed in a cross-point latch according to an embodiment of the present invention.

FIG. 3 is a graph showing voltage-current characteristics of the first and second switches 4 and 5 (refer to FIG. 2) having a unipolar switching characteristic, according to an embodiment of the present invention.

Referring to FIG. 3, when a voltage equal to or greater than a set voltage Vs is applied to the first and second switches 4 and 5, the resistances of the first and second switches 4 and 5 are rapidly reduced. At this point, the first and second switches 4 and 5 are in an ON state. The ON state is a closed state of the first and second switches 4 and 5. At the ON state, the first and second switches 4 and 5 follow a second graph G22. When a voltage equal to or greater than a reset voltage Vr is applied to the first and second switches 4 and 5, the first and second switches 4 and 5 follow a first graph G11, that is the resistance of the first and second switches 4 and 5 rapidly increase. At this point, the first and second switches 4 and 5 are in an OFF state. The OFF state is an opened state of the first and second switches 4 and 5. The set voltage Vs and the reset voltage Vr are separated by a predetermined gap. Thus, the first and second switches 4 and 5 have one state, that is, the OFF state at a first voltage V1 between the set voltage Vs and the reset voltage Vr, and the first and second switches 4 and 5 have one state, that is, the ON state at a second voltage V2 which is greater than the reset voltage Vr. Therefore, the circuit can be turned off by applying the first voltage V1 to the first and second switches 4 and 5, or the circuit can be turned on by applying the second voltage V2 to the first and second switches 4 and 5. Therefore, the cross-point latch according to an embodiment of the present invention does not require a preparation operation for turning ON or OFF the first and second switches 4 and 5. Thus, the use of the cross-point latch according to an embodiment of the present invention can reduce the signal latching time.

The metal oxide included in the first and second switches 4 and 5 is chemically, physically, and thermally stable compared to molecules used for the conventional cross-point latch. Thus, in the present invention, the cross-point latch can be manufactured more easily with improved reliability.

Figure 4:
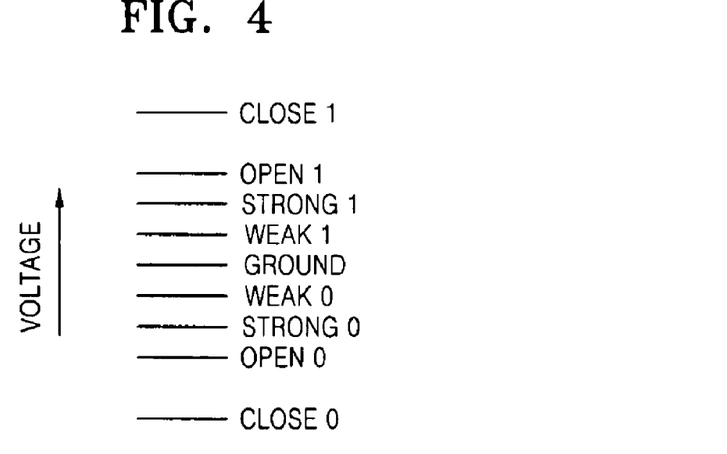
FIG. 4 is a schematic drawing showing voltage levels in a vertical scale for operating a cross-point latch according to an embodiment of the present invention.

FIG. 4 is a schematic drawing showing vertical scaled voltage levels applied to the signal line 1 and the first and second switches 4 and 5 for operating a cross-point latch according to an embodiment of the present invention.

Referring to FIG. 4, negative voltages of 'close 0', 'open 0', 'strong 0', and 'weak 0', are present below a 'ground' voltage, and positive voltages of 'weak 1', 'strong 1', 'open 1', and 'close 1' are present above the 'ground' voltage. The 'strong 0' and the 'weak 0' respectively are a lower limit and an upper limit that can be applied to the signal line 1 for logic 0, and the 'weak 1' and the 'strong 1' respectively are a lower limit and an upper limit of voltages that can be applied to the signal line 1 for logic 1. Each of the voltages applied to the first and second switches 4 and 5 is the difference between the voltage applied to the signal line 1 and the voltages applied to the first and second control lines 2 and 3.

In FIG. 4, when a voltage greater than the 'close 1' voltage which is the largest positive voltage is applied to the first and second switches 4 and 5, the first and second switches 4 and 5 are closed. When the voltages from the 'close 1' to the 'open 1' are applied to the first and second switches 4 and 5, the first and second switches 4 and 5 are opened. Also, when a negative voltage smaller than the 'close 0' which is the smallest negative voltage is applied to the first and second switches 4 and 5, the first and second switches 4 and 5 are closed. Also, the voltages from the 'close 0' to the 'open 0' are applied to the first and second switches 4 and 5, the first and second switches 4 and 5 are opened.

FIGS. 5A through 5D are schematic drawings for explaining the variation of voltage applied to the first and second switches 4 and 5 according to the voltage applied to the signal line 1 and the first and second control lines 2 and 3 of FIG. 2.

In FIGS. 5A through 5D, the heights 42 and 47 of rectangular bars 14 from the 'ground' indicate voltages applied to the first control line 2 or the second control line 3. The heights 43, 45, 46, and 49 of apexes of pentagonal towers 15 that are drawn to be extended from the 'ground' indicate voltages applied to the signal line 1. The pentagonal towers 15 overlap with the rectangular bars 14 or extend in an opposite direction. Assuming that the farthest portions of the rectangular bars 14 from the 'ground' are upper ends, the heights from the 'ground' to apexes 41, 44, 48, and 50 of second pentagonal towers 15' extending upper or lower directions from the upper ends of the rectangular bars 14 indicate voltages applied to the first switch 4 or the second switch 5.

Figure 5A:
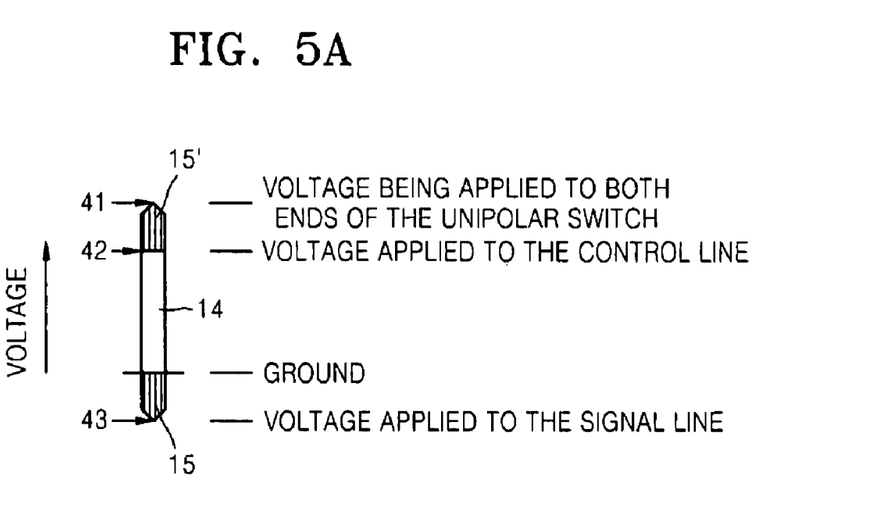

Referring to FIG. 5A, when a positive voltage 42 (hereinafter, a third voltage 42) corresponding to the height 42 of the rectangular bar 14 is applied to the first control line 2 and a negative voltage 43 (hereinafter, a fourth voltage 43) corresponding to the height 43 of the pentagonal towers 15 is applied to the signal line 1, a voltage corresponding to the difference of the third voltage 42 and the fourth voltage 43, that is, a voltage (hereinafter, a fifth voltage 41) corresponding to the height from the 'ground' to the apex 41 of the second pentagonal tower 15' is applied to the first switch 4 formed between the signal line 1 and the first control line 2. The fifth voltage 41 is greater than the third voltage 42 applied to the first control line 2.

Figure 5B:
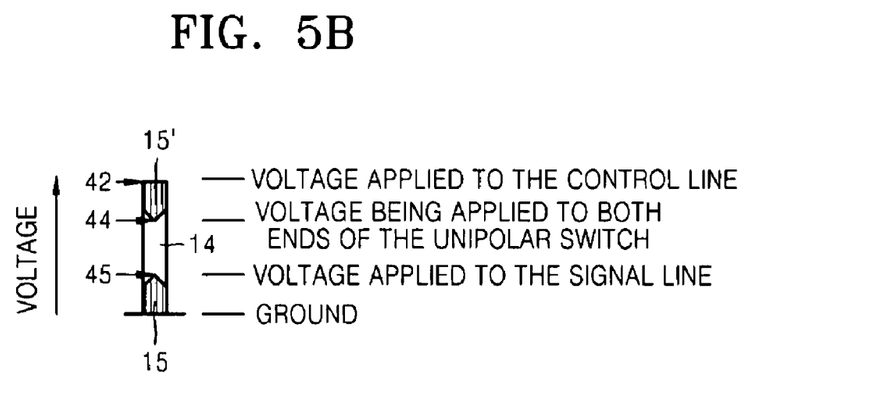

Referring to FIG. 5B, when the third voltage 42 is applied to the first control line 2 and a positive voltage 45 (hereinafter, a sixth voltage 45) corresponding to the height 45 of the pentagonal tower 15 is applied to the signal line 1, a voltage corresponding to the difference between the third voltage 42 and the sixth voltage 45, that is, a voltage 44 (hereinafter, a seventh voltage 44) corresponding to the height from the 'ground' to the apex 44 of the second pentagonal tower 15' is applied to the first switch 4 formed between the first control line 2 and the signal line 1. The seventh voltage 44 is greater than the third voltage 42 applied to the first control line 2.

Figure 5C:
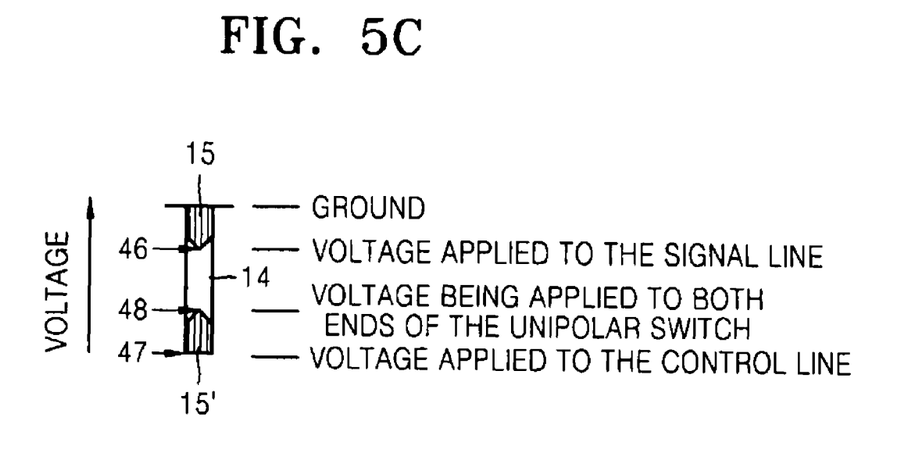
Figure 5D:
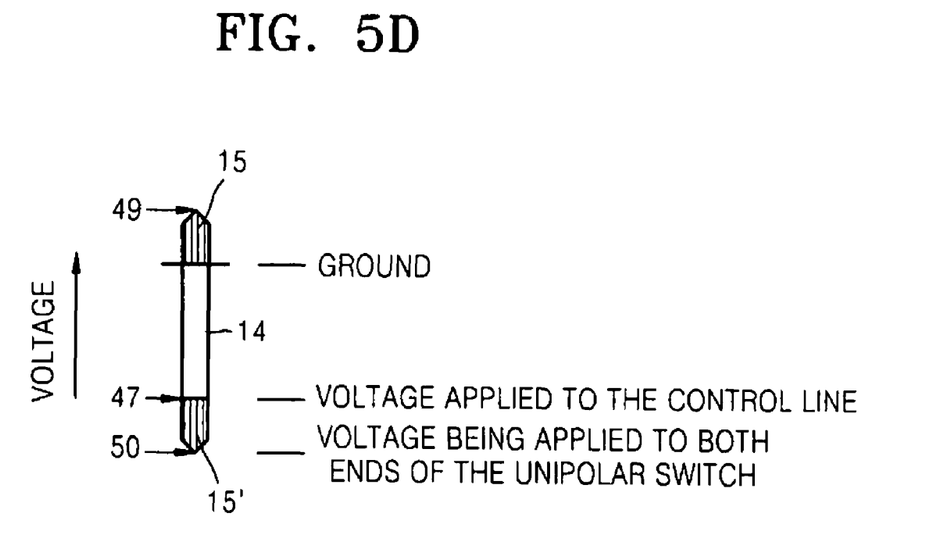

Referring to FIGS. 5C and 5D, a voltage applied to the second control line 3, that is, a voltage 47 (hereinafter, an eighth voltage 47) corresponding to the height 47 of the rectangular bar 14 has an opposite sign from the third voltage 42. In FIG. 5C, a negative voltage 46 (hereinafter, a ninth voltage 46) corresponding to the height 46 of the pentagonal tower 15 is applied to the signal line 1, and in FIG. 5D, a positive voltage 49 (hereinafter, a tenth voltage 49) corresponding to the height 49 of the pentagonal tower 15 is applied to the signal line 1. In FIG. 5C, a voltage applied to the second switch 5, that is, a voltage 48 (hereinafter, an eleventh voltage 48) corresponding to the height from the 'ground' to the apex 48 of the second pentagonal tower 15' is the difference between the eighth voltage 47 applied to the second control line 3 and the ninth voltage 46 applied to the signal line 1. In FIG. 5D, a voltage applied to the second switch 5, that is, a voltage 50 (hereinafter, a twelfth voltage 50) corresponding to the height from the 'ground' to the apex 50 of the second pentagonal tower 15' is the voltage difference between the eighth voltage 47 applied to the second control line 3 and the tenth voltage 49 applied to the signal line 1. The ninth and tenth voltages 46 and 49 respectively can be equal to the fourth voltage 43 of FIG. 5A and the sixth voltage 45 of FIG. 5B.

Figure 6A:
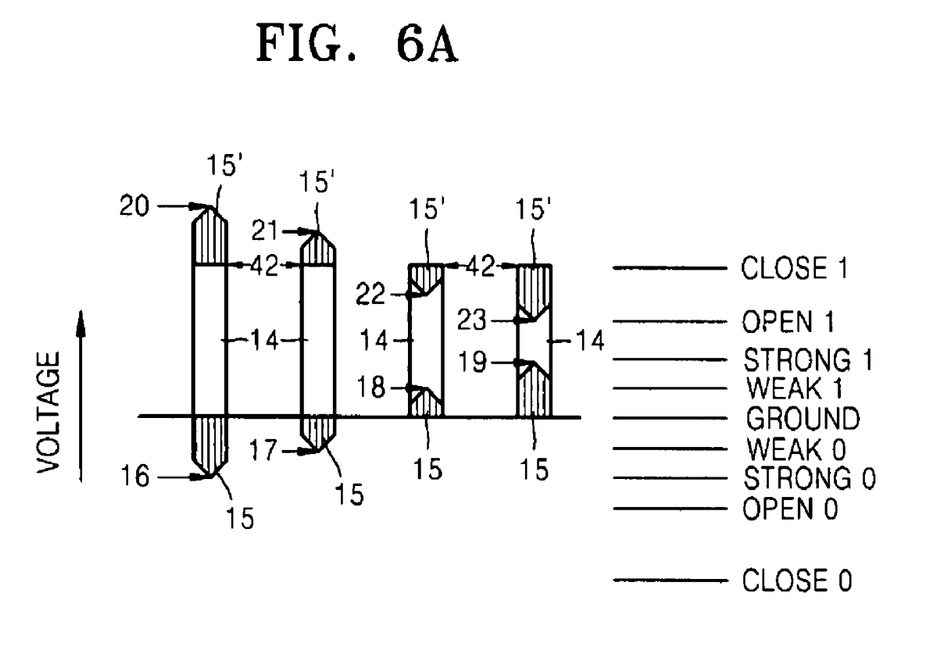
Figure 6B:
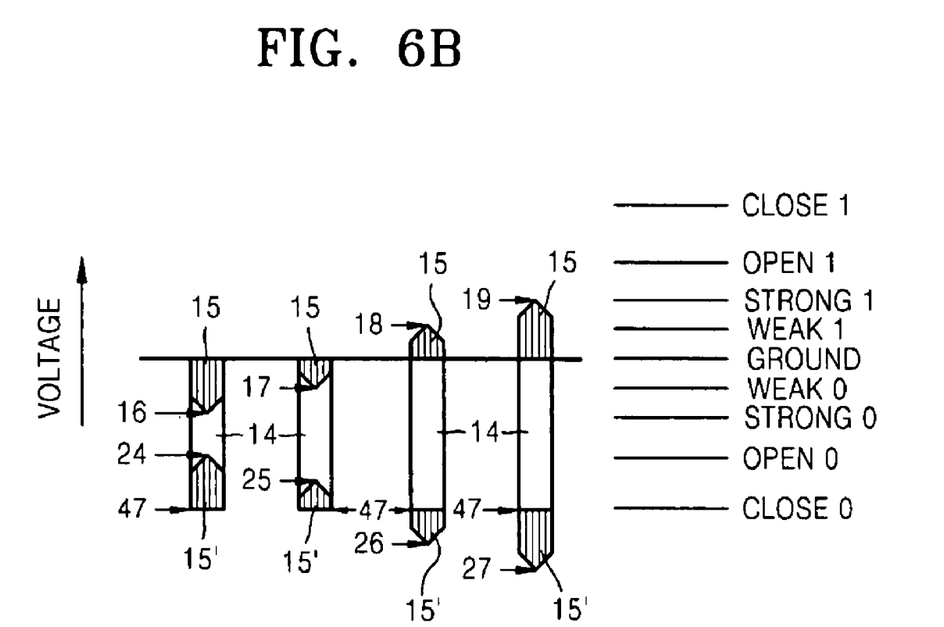

FIGS. 6A and 6B are schematic drawings showing the variation of voltages applied to the first and second switches 4 and 5 according to the voltage applied to the signal line 1 and the first and second control lines 2 and 3 of FIG. 2.

FIG. 6A shows the variation of voltage applied to the first switch 4 according to the voltage applied to the signal line 1 when the voltage applied to the first control line 2 is the positive third voltage 42.

Referring to FIG. 6A, if the heights 16, 17, 18, and 19 of pentagonal towers 15 indicate voltages applied to the signal line 1 respectively correspond to voltage levels of 'strong 0', 'weak 0', 'weak 1', and 'strong 1', thirteenth through sixteenth voltages are applied to the first switch 4. The thirteenth through sixteenth voltages are voltages corresponding to the heights from the 'ground' to apexes 20, 21, 22, and 23 of the second pentagonal towers 15'. Hereinafter, the thirteenth through sixteenth voltages will be described as the thirteenth through sixteenth voltages 20, 21, 22, and 23. If a voltage applied to the signal line 1 lies between the 'strong 0' and the 'weak 0', the thirteenth and fourteenth voltages 20 and 21 applied to the first switch 4 become greater than the 'close 1', and thus, the first switch 4 is closed. If a voltage applied to the signal line 1 lies between the 'weak 1' and the 'strong 1', the fifteenth and sixteenth voltages 22 and 23 applied to the first switch 4 lies between the 'open 1' and the 'close 1', and thus, the first switch 4 is opened.

FIG. 6B shows the variation of voltages applied to the second switch 5 according to a voltage applied to the signal line 1 when a voltage applied to the second control line 3 is the negative eighth voltage 47.

Referring to FIG. 6B, when the heights 16, 17, 18, and 19 of pentagonal towers 15 indicate voltages applied to the signal line 1 respectively correspond to voltage levels of 'strong 0', 'weak 0', 'weak 1', and 'strong 1', seventeenth through twentieth voltages are applied to the second switch 5. The seventeenth through twentieth voltages are voltages corresponding to the heights from the 'ground' to apexes 24, 25, 26, and 27 of the second pentagonal towers 15'. Hereinafter, the seventeenth through twentieth voltages will be described as the seventeenth through twentieth voltages 24, 25, 26, and 27. If a voltage applied to the signal line 1 lies between the 'strong 0' and the 'weak 0', the second switch 5 is opened. If the voltage applied to the signal line 1 lies between the 'weak 1' and the 'strong 1', the second switch 5 is closed.

In consideration of the principle of latching operation, in the cross-point latch according to an embodiment of the present invention, when a particular logic value is applied to the signal line 1, one of the first and second switches 4 and 5 is opened and the other one is closed. Thus, when the voltage inputted to the signal line 1 maintains uniform, a positive voltage is applied to one of the first and second control lines 2 and 3, and a negative voltage is applied to the other one.

Figure 7A:
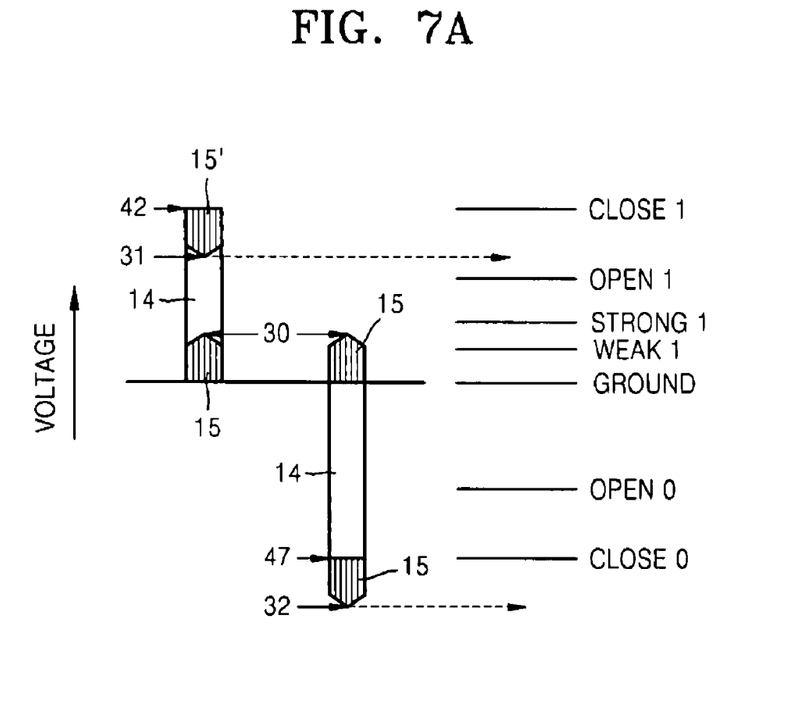

FIG. 7A shows the state of the first and second switches 4 and 5 if the positive third voltage 42 is applied to the first control line 2 and the negative eighth voltage 47 is applied to the second control line 3 when the apex 30 of the pentagonal tower 15 indicates a voltage applied to the signal line 1 lies between the 'strong 1' and the 'weak 1'.

In FIG. 7A, the left one shows the state of the first switch 4, and the right one shows the state of the second switch 5.

Referring to FIG. 7A, a voltage smaller than the third voltage 42, that is, a voltage corresponding to the height from the 'ground' to the apex 31 of the second pentagonal tower 15' is applied to the first switch 4 which is connected to the first control line 2, and the first switch 4 is opened. A voltage smaller than the eighth voltage 47, that is, a voltage corresponding to the height from the 'ground' to the apex 32 of the second pentagonal tower 15' is applied to the second switch 5, and the second switch 5 is closed. Through these processes, the signal line 1 is connected to the second control line 3 through the second switch 5.

Figure 7B:
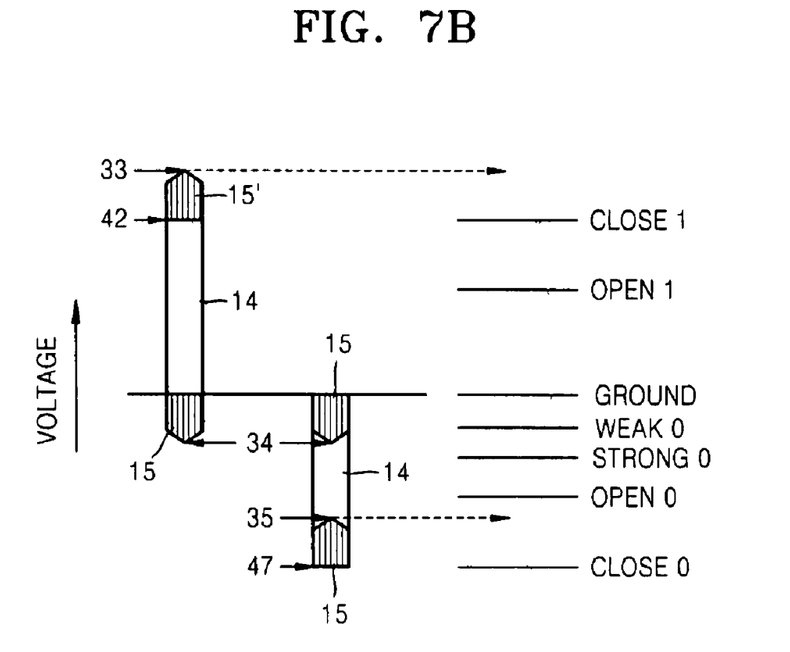

FIG. 7B shows the states of the first and second switches 4 and 5 if the positive third voltage 42 is applied to the first control line 2 and the negative eighth voltage 47 is applied to the second control line 3, and when a voltage applied to the signal line 1, that is, a voltage corresponding to the height 34 of the pentagonal tower 15 lies between the 'weak 0' and the 'strong 0'.

In FIG. 7B, the left one shows the state of the first switch 4, and the right one shows the state of the second switch 5.

Referring to FIG. 7B, the first switch 4 is closed, and the second switch 5 is opened. Through these processes, the signal line 1 is connected to the first control line 2 through the first switch 4.

As described above, in the case of the cross-point latch according to the present invention, a desired switch can be selectively switched ON or OFF by sequentially applying a predetermined voltage pulse to the first and second control lines 2 and 3 in a state that a predetermined voltage is applied to the signal line 1. Thus, the use of the cross-point latch according to the present invention can reduce latching time.

Figure 8A:
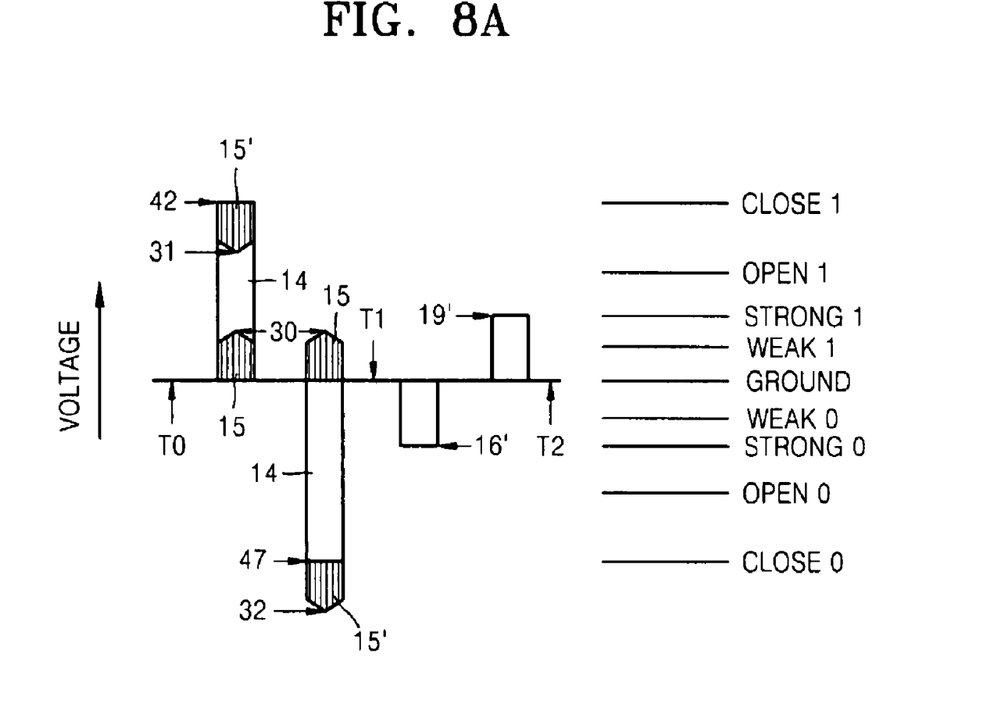
FIGS. 8A and 8B are schematic drawings for explaining the variation of voltage applied to a signal line and a control line of the cross-point latch in a method of latching a logic value and reconstructing a signal using a cross-point latch according to an embodiment of the present invention, and the variation of voltage applied to a switch according to the variation of voltage applied to a signal line and a control line of the cross-point latch.
Figure 8B:
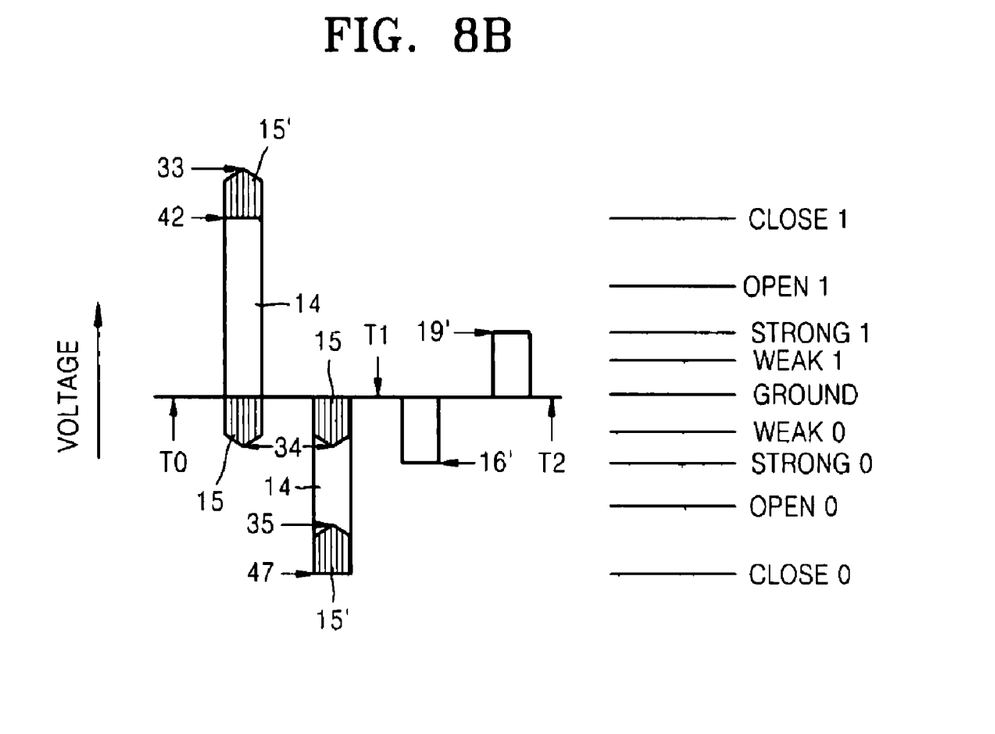

FIGS. 8A and 8B are schematic drawings for explaining the sequence of applying a voltage to the first and second control lines 2 and 3. A method of latching a logic value using the cross-point latch according to the present invention and a method of signal restoration will now be described with reference to FIGS. 8A and 8B.

From point T0 to point T1 in FIG. 8A, a positive voltage (hereinafter, a first input voltage 30) corresponding to a height 30 of the pentagonal tower 15 of FIG. 7A is applied to the signal line 1, and from point T0 to point T1 in FIG. 8B, a negative voltage (hereinafter, a second input voltage 34) corresponding to a height 34 of the pentagonal tower 15 of FIG. 7B is applied to the signal line 1.

A voltage sequence from point T0 to point T1 of FIG. 8A is the same as the voltage sequence of FIG. 7A. Thus, at the point T1 of FIG. 8A, the first switch 4 is opened and the second switch 5 is closed. After the point T1, in a state that a voltage is not applied to the signal line 1, a voltage 16' corresponding to the 'strong 0' level is applied to the first control line 2, and a voltage 19' corresponding to the 'strong 1' level is applied to the second control line 3. At this point, since only the second switch 5 is closed, a voltage corresponding to the 'strong 1' level is outputted to the signal line 1 through the second control line 3 and the second switch 5. The voltage corresponding to the 'strong 1' level outputted through the second control line 3 is similar to the first input voltage 30 inputted to the signal line 1 at the point T0. An ideal state of the first input voltage 30 is the same state as the 'strong 1' level. However, generally, the first input voltage 30 lies between the 'strong 1' level and the 'weak 1' level. The first input voltage 30 is a voltage for logic 1. When the first input voltage 30 for logic 1 is inputted to the cross-point latch according to the present invention, a voltage corresponding to the 'strong 1' level which is similar to the first input voltage 30 is outputted. This is the latching process of logic 1.

Referring to FIG. 8B, a voltage sequence from point T0 to point T1 of FIG. 8B is the same as the voltage sequence of FIG. 7B. Thus, at the point T1 of FIG. 8B, the first switch 4 is closed and the second switch 5 is opened. After the point T1, in a state that a voltage is not applied to the signal line 1, a voltage 16' corresponding to the 'strong 0' level is applied to the first control line 2, and a voltage 19' corresponding to the 'strong 1' level is applied to the second control line 3. At this point, since only the second switch 4 is closed, a voltage corresponding to the 'strong 0' level is outputted to the signal line 1 through the first control line 2 and the first switch 4. The voltage corresponding to the 'strong 0' level outputted through the first control line 2 is similar to the second input voltage 34 inputted to the signal line 1 at the point T0. An ideal state of the second input voltage 34 is the same state as the 'strong 0' level. However, generally, the second input voltage 34 lies between the 'strong 0' level and the 'weak 0' level. The second input voltage 34 is a voltage for logic 0. When the second input voltage 34 for logic 0 is inputted to the cross-point latch according to the present invention, a voltage corresponding to the 'strong 0' level which is similar to the second input voltage 34 is outputted. This is the latching process of logic 0.

The restoration of signal can be performed as the same process as the latching process. That is, as depicted in FIG. 8A, when the first input voltage 30 is inputted, a voltage corresponding to the 'strong 1' level which is the maximum voltage for logic 1 can be outputted. For example, the first input voltage 30 is 0.8V and the voltage corresponding to the 'strong 1' level can be 1V. This denotes that a voltage weaken in a predetermined circuit can be restored by the cross-point latch according to the present invention. Similarly, the second input voltage 34 weaken to approximately −0.8V can be restored to a voltage corresponding to the 'strong 1' level of −1V. Thus, the cross-point latch according to the present invention can be used for signal restoration.

Figure 9A:
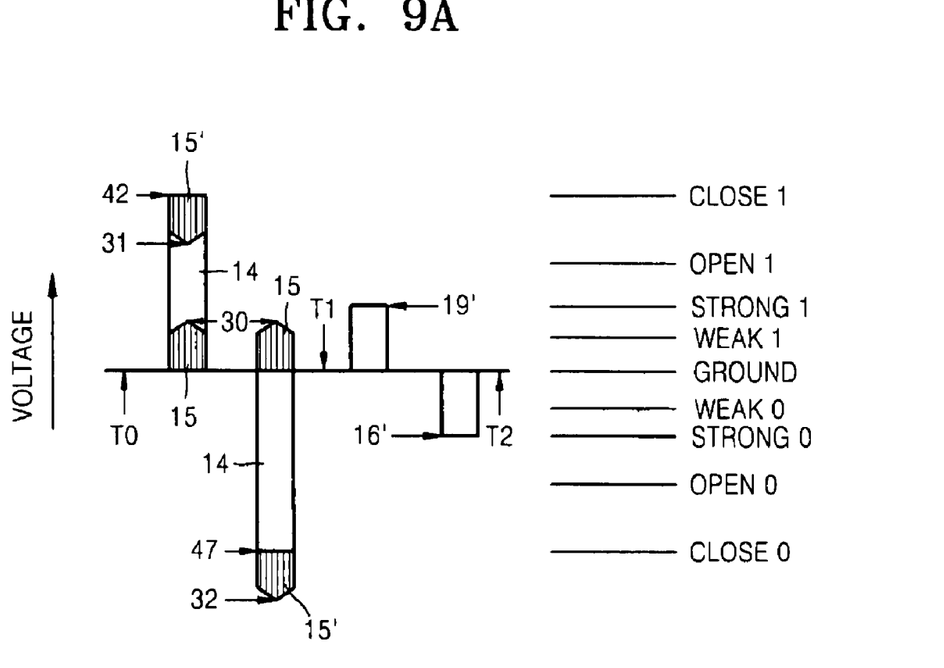
FIGS. 9A and 9B are schematic drawings for explaining the variation of voltage applied to a signal line and a control line of the cross-point latch in a method of inverting a signal using a cross-point latch according to an embodiment of the present invention, and the variation of voltage applied to a switch accordingly.
Figure 9B:
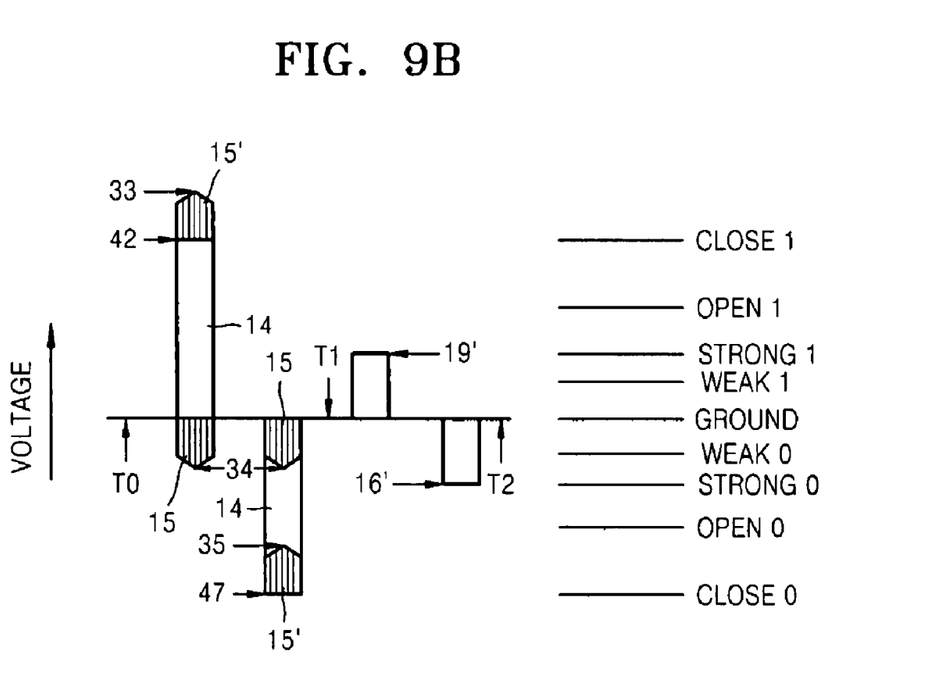

FIGS. 9A and 9B are schematic drawings for explaining the sequence of applying a voltage to the first and second control lines 2 and 3. A method of inverting signal using the cross-point latch according to the present invention will now be described with reference to FIGS. 9A and 9B. In FIGS. 9A and 9B, the processes from the point T0 to the point T1 are identical to the processes in FIGS. 8A and 8B. Thus, a process after the point T1 will now be described.

Referring to FIG. 9A, at the point T1, the first switch 4 is opened and the second switch 5 is closed. After the point T1, in a state that a voltage is not applied to the signal line 1, a voltage 19' corresponding to the 'strong 1' level is applied to the first control line 2, and a voltage 16' corresponding to the 'strong 0' level is applied to the second control line 3. At this point, since only the second switch 5 is closed, the voltage 16' corresponding to the 'strong 0' level is outputted to the signal line 1 through the second control line 3 and the second switch 5. For example, when the first input voltage 30 of 0.8V is applied to the signal line 1, a voltage corresponding to the 'strong 0' level of −1V is outputted by the cross-point latch. That is, the first input voltage 30 similar to the voltage corresponding to the 'strong 1' level is inputted, and a voltage corresponding to the 'strong 0' level corresponding to the logic 0 is outputted. This is a first inversion process of a signal. Accordingly, in this case, the first input voltage 30 applied to the signal line 1 is an input voltage for outputting the logic 0.

Referring to FIG. 9B, at the point T1, the first switch 4 is closed, and the second switch 5 is opened. After the point T1, in a state that a voltage is not applied to the signal line 1, a voltage 19' corresponding to the 'strong 1' level is applied to the first control line 2, and a voltage 16' corresponding to the 'strong 1' level is applied to the second control line 3. At this point, since only the first switch 4 is closed, the voltage 19' corresponding to the 'strong 1' level is outputted to the signal line 1 through the first control line 2 and the first switch 4. For example, when the second input voltage 34 of −0.8V is applied to the signal line 1, a voltage corresponding to the 'strong 1' level of 1V is outputted by the cross-point latch. That is, the second input voltage 34 similar to the voltage corresponding to the 'strong 0' level is inputted, and a voltage corresponding to the 'strong 1' level corresponding to the logic 1 is outputted. This is a second inversion process of a signal. Accordingly, in this case, the second input voltage 34 applied to the signal line 1 is an input voltage for outputting the logic 1.

As described above, the cross-point latch according the present invention can reduce latching time by using switches having a unipolar characteristic.

Also, in the cross-point latch according the present invention, the switches can be formed of a metal oxide, and thus, has low manufacturing costs and higher reliability compared to a conventional cross-point latch that uses molecules as switch material.

Also, the cross-point latch according the present invention can be manufactured using a process similar to the manufacturing process of a resistive memory device. Thus, a memory device and a logic device including the cross-point latch according to the present invention can be formed on one substrate at the same time. That is, the memory device and the logic device can be easily combined.

While the present invention has been particularly shown and described with reference to embodiments thereof, it should not be construed as being limited to the embodiments set forth herein but as an exemplary. Those who skilled in this art, for example, a plurality of signal lines 1 can be arranged in the cross-point latch according to an embodiment of the present invention. That is, two or more signal lines 1 can cross the two control lines 2 and 3. Therefore, the scope of the invention is defined not by the detailed description of the invention but by the appended claims.

What is claimed is:

1. A cross-point latch comprising:
a signal line;
two control lines crossing the signal line; and
unipolar switches disposed at crossing points between the signal line and the control lines,
wherein
the cross-point latch is configured to output a signal corresponding to a first logic to the signal line through one of the two control lines and a corresponding unipolar switch after inputting a signal for the first logic to the signal line, and the unipolar switches are configured to
open by applying a voltage between an 'open 1' and a 'close 1' to the unipolar switches or by applying a voltage between an 'open 0' and a 'close 0' to the unipolar switches, and
close by applying a voltage greater than the 'close 1' or smaller than the 'close 0' to the unipolar switches, the 'open 1' and the 'close 1' being greater than a 'ground' voltage, the 'open 0' and the 'close 0' being smaller than the 'ground' voltage, the 'open 1' being smaller than the 'close 1', and the 'close 0' being smaller than the 'open 0'.

2. The cross-point latch of claim 1, wherein the unipolar switches comprise a variable resistive material.

3. The cross-point latch of claim 2, wherein the variable resistive material is a metal oxide.

4. The cross-point latch of claim 3, wherein the metal oxide is one selected from the group consisting of NiO, FeO, CoO, $NbO_2$, $ZrO_2$, $HfO_2$, ZnO, TbO, YO, and $WO_3$.

5. A method of operating a cross-point latch that comprises a signal line, first and second control lines crossing the signal line, and unipolar switches disposed at crossing points between the signal line and the first and second control lines, the cross-point latch being configured to output a signal corresponding to a first logic to the signal line through one of the first and second control lines and a corresponding unipolar switch after inputting a signal for the first logic to the signal line, the method comprising:
while an input voltage is applied to the signal line, applying voltages different from each other to the first and second control lines in order to close one of the unipolar switches and open the other one (Operation 1), wherein
the unipolar switch is opened by applying a voltage between a 'open 1' and a 'close 1' or a voltage between a 'open 0' and a 'close 0' to the unipolar switch, and
the unipolar switch is closed by applying a voltage greater than the 'close 1' or smaller than the 'close 0' to the unipolar switch,
wherein the 'open 1' and the 'close 1' are greater than a 'ground' voltage, the 'open 0' and the 'close 0' are smaller than the 'ground' voltage,
the 'open 1' is smaller than the 'close 1', and the 'close 0' is smaller than the 'open 0'.

6. The method of claim 5, wherein the input voltage is for outputting a logic 1 and lies between 'weak 1' and 'strong 1', wherein the 'weak 1' and the 'strong 1' lies between the 'ground' voltage and the 'open 1', and wherein the 'weak 1' is smaller than the 'strong 1'.

7. The method of claim 5, wherein the input voltage is for outputting a logic 0 and lies between 'weak 0' and 'strong 0', wherein the 'weak 0' and the 'strong 0' lies between the 'ground' voltage and the 'open 0', and wherein the 'weak 0' is greater than the 'strong 0'.

8. The method of claim 6, further comprising, while the input voltage is not applied to the signal line, applying a voltage of the 'strong 1' level to the control line connected to the closed unipolar switch (Operation 2) after the operation 1, wherein the operations 1 and 2 are methods of latching a logic value using the cross-point latch or methods of signal restoration.

9. The method of claim 7, further comprising, while the input voltage is not applied to the signal line, applying a voltage of the 'strong 0' level to the control line connected to the closed unipolar switch (Operation 2) after the operation 1, wherein the operations 1 and 2 are methods of latching a logic value using the cross-point latch or methods of signal restoration.

10. The method of claim 5, wherein the input voltage is for outputting a logic 0 and lies between 'weak 1' and 'strong 1', wherein the 'weak 1' and the 'strong 1' lies between the 'ground' voltage and the 'open 1', and wherein the 'weak 1' is smaller than the 'strong 1'.

11. The method of claim 5, wherein the input voltage is for outputting a logic 1 and lies between 'weak 0' and 'strong 0', wherein the 'weak 0' and the 'strong 0' lies between the 'ground' voltage and the 'open 0', and wherein the 'weak 0' is greater than the 'strong 0'.

12. The method of claim 10, further comprising, while the input voltage is not applied to the signal line, applying a voltage of the 'strong 0' level to the control line connected to the closed unipolar switch (Operation 2) after the operation 1,
wherein the operations 1 and 2 are methods of inverting a signal using the cross-point latch.

13. The method of claim 11, further comprising, while the input voltage is not applied to the signal line, applying a voltage of the 'strong 1' level to the control line connected to the closed unipolar switch (Operation 2) after the operation 1,
wherein the operations 1 and 2 are methods of inverting a signal using the cross-point latch.

14. The method of claim 5, wherein the unipolar switches comprise a variable resistive material.

15. The method of claim 14, wherein the variable resistive material is a metal oxide.

16. The method of claim 15, wherein the metal oxide is one selected from the group consisting of NiO, FeO, CoO, $NbO_2$, $ZrO_2$, $HfO_2$, ZnO, TbO, YO, and $WO_3$.

17. The cross-point latch of claim 1, wherein the cross-point latch is configured to output a signal corresponding to a second logic to the signal line through the other one of the two control lines and a corresponding unipolar switch after inputting a signal for the second logic to the signal line.

18. The cross-point latch of claim 1, wherein the input signal for the first logic is a positive voltage signal, and the output signal corresponding to the first logic is a positive voltage signal.

19. The cross-point latch of claim 1, wherein the input signal for the first logic is a positive voltage signal, and the output signal corresponding to the first logic is a negative voltage signal.

20. The cross-point latch of claim 17, wherein the input signal for the second logic is a negative voltage signal, and the output signal corresponding to the second logic is a negative voltage signal.

21. The cross-point latch of claim 17, wherein the input signal for the second logic is a negative voltage signal, and the output signal corresponding to the second logic is a positive voltage signal.

* * * * *